United States Patent [19]

Sato et al.

[11] Patent Number: 4,857,757
[45] Date of Patent: * Aug. 15, 1989

[54] DRIVE CIRCUIT FOR A TWO LAYER LAMINATED ELECTROSTRICTION ELEMENT

[75] Inventors: Ryuichi Sato; Tsutomu Taniguchi, both of Kyoto; Masatoshi Ohba, Nagaokakyo, all of Japan

[73] Assignee: Omron Tateisi Electronics Co., Kyoto, Japan

[*] Notice: The portion of the term of this patent subsequent to Feb. 4, 2003 has been disclaimed.

[21] Appl. No.: 750,212

[22] Filed: Jul. 1, 1985

[30] Foreign Application Priority Data

Jun. 29, 1984 [JP] Japan ................ 59-135843

[51] Int. Cl.$^4$ .................................. H01L 41/00
[52] U.S. Cl. ......................... 307/113; 307/400; 307/597; 310/316; 310/317; 200/181; 361/207
[58] Field of Search ............. 307/112, 113, 115, 117, 307/400, 116, 119, 132 E, 132 R, 132 EA, 132 T; 200/181; 310/316, 317, 332; 361/139, 140, 160, 161, 162, 163, 166, 206, 207

[56] References Cited

U.S. PATENT DOCUMENTS

| | | | |
|---|---|---|---|
| 2,835,761 | 5/1958 | Crownover | 361/201 X |
| 2,836,737 | 5/1958 | Crownover | 361/207 X |
| 2,927,255 | 3/1960 | Diesel | 361/207 |
| 2,978,615 | 4/1961 | Chater | 361/160 |
| 3,067,364 | 12/1962 | Rosso | 361/181 |
| 3,161,782 | 12/1964 | Vieth | 361/162 X |
| 3,307,082 | 2/1967 | Riedmayr | 361/160 |
| 3,365,592 | 1/1968 | Krautwald et al. | 200/181 X |
| 3,599,049 | 8/1971 | Barnard | 361/162 |
| 3,809,927 | 5/1974 | Takagi et al. | 307/597 |
| 3,934,158 | 1/1976 | Shinozaki | 361/92 X |
| 4,093,883 | 6/1978 | Yamamoto | 310/317 |
| 4,237,399 | 12/1980 | Sakamoto | 310/317 |
| 4,376,255 | 3/1983 | Kleinschmidt | 310/317 |
| 4,400,642 | 8/1983 | Kiraly | 310/332 |
| 4,403,166 | 9/1983 | Tanaka et al. | 310/332 |
| 4,461,968 | 7/1984 | Kolm et al. | 200/181 X |
| 4,520,289 | 5/1985 | Sato et al. | 310/317 X |
| 4,533,849 | 8/1985 | Schnell | 310/330 |
| 4,565,940 | 1/1986 | Hubbard | 310/317 X |
| 4,568,849 | 2/1986 | Sato et al. | 200/181 X |

Primary Examiner—William M. Shoop, Jr.
Assistant Examiner—Shik Luen Paul Ip
Attorney, Agent, or Firm—Wegner & Bretschneider

[57] ABSTRACT

A drive circuit of a two-laminated electrostriction element, wherein a common junction of two sheets of electric distortion elements is connected to one of the driving power source through a first switching means, and the other terminal of the one electrostriction element is connected to the other of said driving power source, with the other terminal of the other electrostriction element being connected to a second switching means, thereby to rotate the other electrostriction element by the voltage charged in the one electrostriction element.

7 Claims, 1 Drawing Sheet

DRIVE CIRCUIT FOR A TWO LAYER LAMINATED ELECTROSTRICTION ELEMENT

BACKGROUND OF THE INVENTION

1. Field of the Invention

The present invention relates to a drive circuit of a two layer laminated electrostriction element.

2. Description of the Prior Art

An electrostriction element is a kind of a capacitor, and accordingly, when the electrostriction element is to be brought into a non-driving state from a driving state, it takes considerable time to make zero the displacement δ of a two-laminated electrostriction element which is formed of two sheets of electrostriction elements are joined at adjacent surfaces thereof, in a generally-used circuit in which voltage impressed on the electrostriction element is simply turned from on to off, as shown in FIG. 1 by one-dot line. Therefore, it has been inconvenient that the two layer laminated electric deflection element cannot be employed in such a drive circuit as a relay wherein contacts are opened and closed alternately and repeatedly, and sometimes in a short period of time.

SUMMARY OF THE INVENTION

The present invention has been developed with a view to substantially solving the above-described inconvenience or disadvantage inherent in the prior art for electrostrictive transducers that depend on production of an elastic strain in certain symmetric crystals when an electric field is applied. It has for its essential object to provide an improved drive circuit of a two layer laminated electrostriction element which can immediately return back to an original state with reduction of the displacement amount when the supply of a drive power is cut off.

BRIEF DESCRIPTION OF THE DRAWINGS

This and other objects and features of the present invention will become apparent from the following description taken in conjunction with one preferred embodiment thereof with reference to the accompanying drawings, in which.

DETAILED DESCRIPTION OF THE EMBODIMENT

Figure 1:
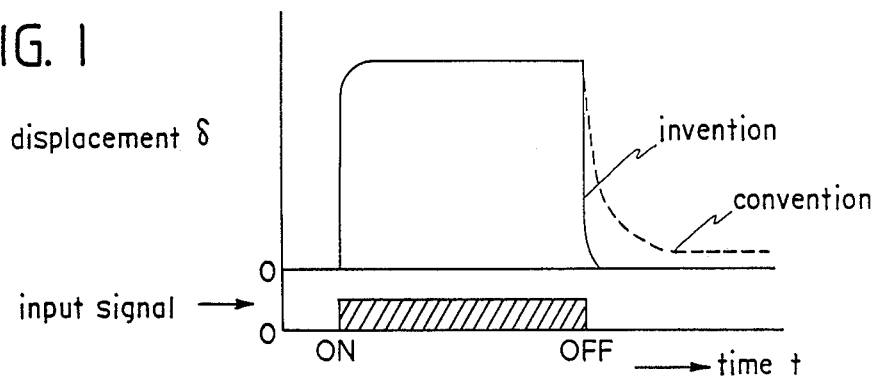
FIG. 1 is a graph showing the relationship between the displacement of a two-laminated electrostriction element and time with respect to the voltage impressed thereonto.

Before the description proceeds, it is to be noted here that like parts are designated by like reference numerals throughout the drawings.

Figure 2:
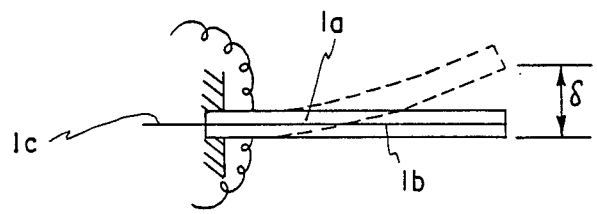
FIG. 2 is a view explanatory of one example of a two-laminated electrostriction element employed in a drive circuit according to the present invention.

Referring to FIG. 2, a two layer laminated electrostriction element 1 is constructed in the manner that two sheets of electric deflection elements 1a and 1b are laminated one after another, with sandwiching an intermediate electrode 1c therebetween.

Figure 3:
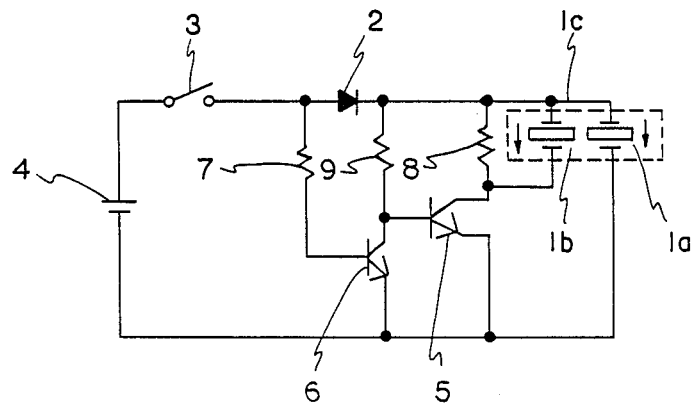
FIG. 3 is a circuit diagram of a drive circuit according to one preferred embodiment of the present invention.

As shown in FIG. 3, a common junction (an intermediate electrode 1c) of the electric deflection elements 1a and 1b is, through a diode 2 and a power switch 3 which is a first switching means, connected to one terminal of a DC power source 4. The other terminal of the electric deflection element 1a is connected to the other terminal of the DC power source 4.

On the other hand, the other terminal of the electric deflection element 1b is connected to the above other terminal of the DC power source 4 through a collector and an emitter of a transistor 5 constituting a second switching means. The base of the transistor 5 is connected to a collector of a transistor 6, the base of which transistor 6 is, through a resistor 7, connected to the power switch 3. Further, collectors of each of the transistors 5 and 6 are connected to the diode 2 through respective resistors 8 and 9.

In the construction as described above, when the power switch 3 is turned on, the transistor 6 is turned on, and the transistor 5 is turned off, with no impression of voltage to the electrostriction element 1b. On the contrary, since the electrostriction element 1a is impressed with voltage at this time, the two layer laminated electrostriction element 1 is deflected by the displacement amount δ.

Thereafter, when the power switch 3 is turned off, the transistor 6 is turned off, and simultaneously the transistor 5 is turned on by the voltage charged in the electrostriction element 1a, such that the electrostriction element 1b is impressed with this voltage to be deflected in a direction contrary to the displacement direction of the electrostriction element 1a. In other words, the deflection of the electrostriction element 1a is returned acceleratedly by the deflection of the electrostriction element 1b. Thus, the displacement amount of the two layer laminated electrostriction element 1 becomes zero rapidly as shown by a solid line in FIG. 1. The transistor 5 is turned off when the charged voltage in the electrostriction element 1a becomes zero.

As is clear from the foregoing description, according to the present invention, two sheets of electrostriction elements are layered one after another to be a two layer laminated electrostriction element wherein one electrostriction element is provided with a switching means which is turned on when the power supply is cut off such that the electrostriction elements are connected in parallel relationship with each other, and the other electrostriction element is forcibly returned back by the voltage charged in the one electrostriction element. Therefore, the two layer laminated electrostriction element can be returned back rapidly from the displacement, thus response characteristic thereof being improved.

Figure 4:
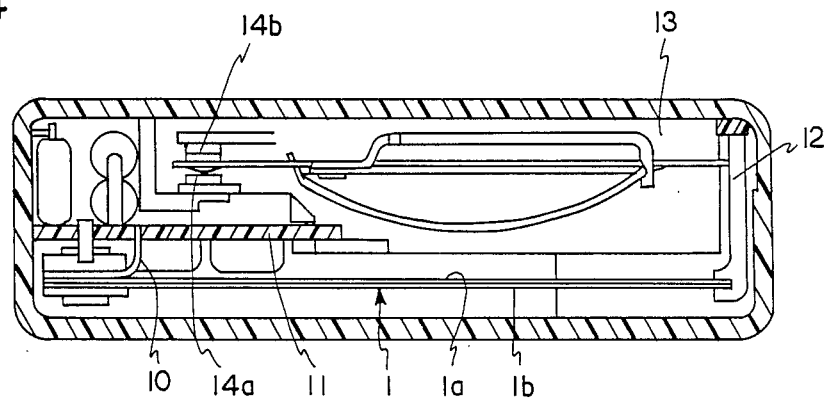
FIG. 4 is a cross sectional view of a relay equipped with the drive circuit of FIG. 3.

Moreover, according to the present invention, since one terminal of the electrostriction elements can be connected directly to a DC power source, it is advantageous, as shown in FIG. 4, in that the two layer laminated electrostriction element can be installed in a printing circuit board or the like at the side of the one electrode thereof by a support member 10 which uses a firm external terminal in common with the element 1. It is to be noted here that in the drawing, reference numerals 11, 12, 13 and, 14a and 14b represent a printing circuit board, a guide, a switching part consisting of a movable piece and the like, and fixed contacts, respectively.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claim.

What is claimed is:

1. A drive circuit for a two layer laminated electrostriction element which is formed by laminating two sheets of electrostrictive deflection elements at adjacent surfaces thereof, comprising:
   a first circuit for charging a first of said deflection elements by applying voltage thereto causing said first deflection element, and thereby said electrostriction element, to deflect in a first direction,
   a second circuit for discharging said first deflection element after said first circuit is deactivated and no longer applying voltage to said first deflection element and
   a third circuit for charging a second of said deflection elements, said second circuit being connected to said third circuit such that a part of the discharging current from said first of said deflection elements is coupled to said third circuit for charging said second deflection element thereby causing said second deflection element, and thereby said electrostriction element, to deflect in a direction opposite to the direction of deflection of said first deflection element.

2. The drive circuit as defined in claim 1, further comprising an intermediate electrode laminated between said first and second deflection elements.

3. The drive circuit as defined in claim 1, wherein said first circuit comprises a first transistor having a first resistor connected in series therewith in the current path thereof, said first transistor and said first resistor being connected in parallel with said first deflection element.

4. The drive circuit defined in claim 3, wherein said second circuit comprises a diode connected in series with said first deflection element.

5. The drive circuit defined in claim 4, wherein said third circuit comprises a second transistor connected in cascade with said first transistor and a second resistor connected in series with said second transistor in the current path thereof, said second resistor and said second transistor being connected in series with said second deflection element.

6. The drive circuit defined in claim 2, wherein said intermediate electrode forms a common connection between said first and second deflection elements and further comprising a switch connecting a power source in series with said intermediate diode.

7. A drive circuit for a two layer laminated electrostriction element which is formed by laminating two sheets of electrostrictive deflection elements at adjacent surfaces thereof, comprising:
   a first circuit including a first transistor and a first resistor connected in series with said first transistor in the current path thereof, said first circuit being connected in parallel with a first of said deflection elements and in parallel with a driving power source such that when said first transistor is rendered conductive a voltage is applied to said first deflection element causing the electrostriction element to deflect in a first direction,
   a second circuit for directing discharge current from said first deflection element to a third circuit and
   a third circuit including a second transistor connected in cascade with said first transistor and a second resistor connected in series with said second transistor in the current path thereof and coupled to receive discharge current from said first deflection element rendering said second transistor operative to actuate said second deflection element causing said electrostriction element to deflect in a direction opposite to the direction of deflection of said first deflection element.

* * * * *